(12) United States Patent
Shah

(10) Patent No.: US 7,304,363 B1
(45) Date of Patent: Dec. 4, 2007

(54) INTERACTING CURRENT SPREADER AND JUNCTION EXTENDER TO INCREASE THE VOLTAGE BLOCKED IN THE OFF STATE OF A HIGH POWER SEMICONDUCTOR DEVICE

(75) Inventor: Pankaj B. Shah, Rockville, MD (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 48 days.

(21) Appl. No.: 10/997,484

(22) Filed: Nov. 26, 2004

(51) Int. Cl.
*H01L 23/58* (2006.01)

(52) U.S. Cl. ............... 257/492; 257/496; 257/E29.009

(58) Field of Classification Search ............... 257/492, 257/506, 524, 495, 330, 331, 339
See application file for complete search history.

(56) References Cited

U.S. PATENT DOCUMENTS

| | | | |
|---|---|---|---|
| 4,242,690 A * | 12/1980 | Temple | ........................ 257/493 |
| 4,648,174 A | 3/1987 | Temple et al. | |
| 4,927,772 A | 5/1990 | Arthur et al. | |
| 5,401,682 A | 3/1995 | Yang | |
| 5,614,421 A | 3/1997 | Yang | |
| 5,712,502 A * | 1/1998 | Mitlehner et al. | .......... 257/341 |
| 5,914,500 A | 6/1999 | Bakowski et al. | |
| 6,008,520 A * | 12/1999 | Darwish et al. | ............ 257/330 |
| 6,191,015 B1 * | 2/2001 | Losehand et al. | ............ 438/570 |
| 6,215,168 B1 | 4/2001 | Brush et al. | |
| 6,410,942 B1 | 6/2002 | Thibeault et al. | |
| 6,570,260 B1 | 5/2003 | Yeh et al. | |
| 6,573,128 B1 | 6/2003 | Singh | |
| 6,673,662 B2 * | 1/2004 | Singh | ......................... 438/167 |
| 6,765,239 B2 * | 7/2004 | Hiyoshi et al. | ............. 257/107 |
| 6,800,917 B2 * | 10/2004 | Haynie et al. | .............. 257/506 |
| 2004/0238903 A1 * | 12/2004 | Zeng et al. | .................. 257/409 |
| 2006/0273346 A1 * | 12/2006 | Pfirsch | ....................... 257/171 |

* cited by examiner

*Primary Examiner*—Sue A. Purvis
*Assistant Examiner*—Benjamin P. Sandvik
(74) *Attorney, Agent, or Firm*—Edward L. Stolarun

(57) ABSTRACT

A technique of spreading current flowing in a semiconductor device comprising an electrode, a drift region adjacent to the electrode, a junction termination extension implant region in the drift region, and a current spreader adjacent to the junction termination extension implant region and the electrode. The current spreader is adapted to reduce current densities and electrostatic fields (preferably simultaneously) in an area connecting the electrode with the drift region. Moreover, the current spreader is adapted to spread current flowing from the electrode into the drift region. The semiconductor device further comprises an ohmic metal contact connected to the electrode and an implant pocket in the drift region, wherein the implant pocket is adapted for terminating electrostatic field lines in the semiconductor device. Preferably, the current spreader comprises an ohmic metal and the electrode comprises any of an anode and a cathode.

24 Claims, 7 Drawing Sheets

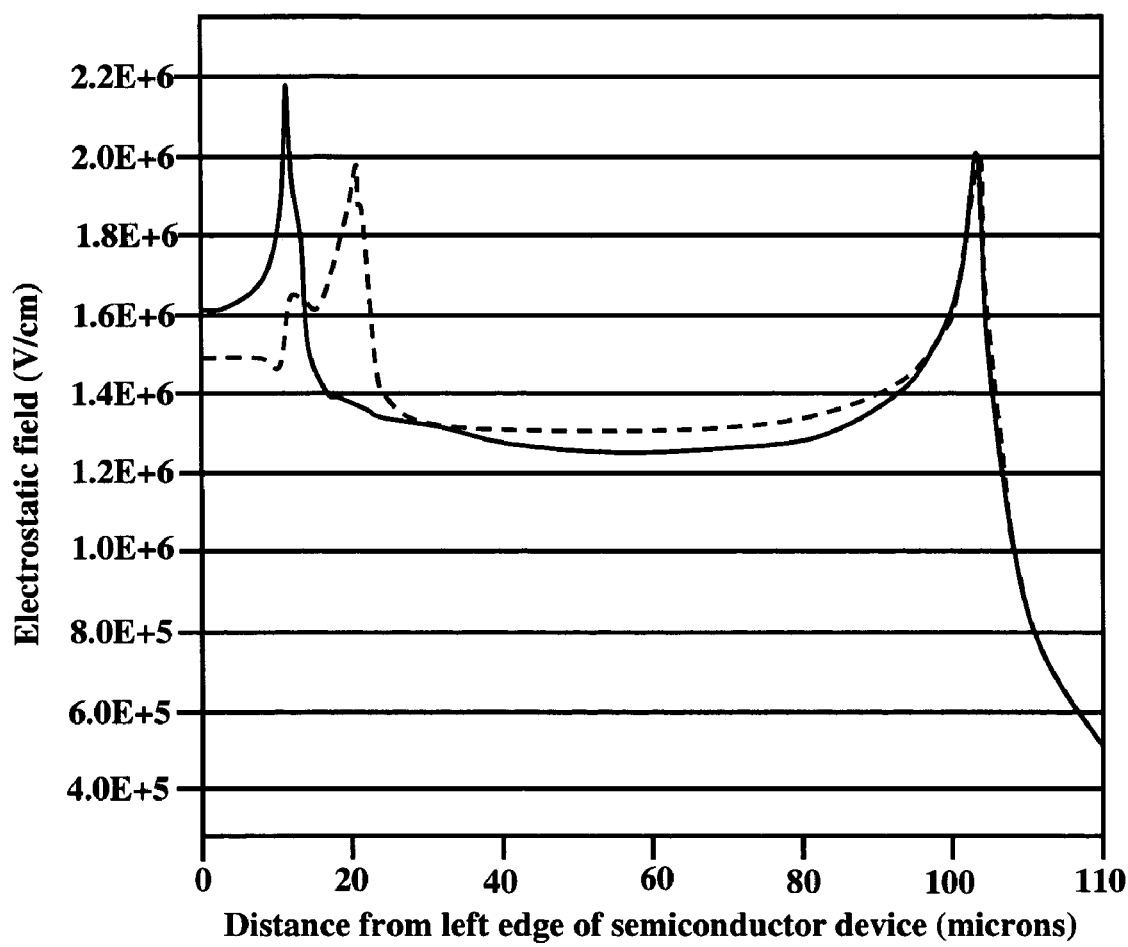

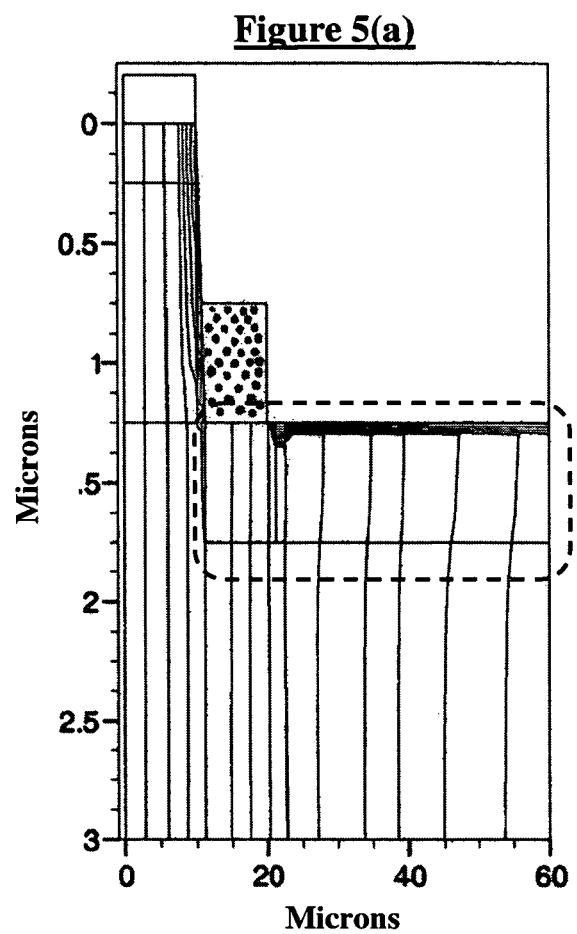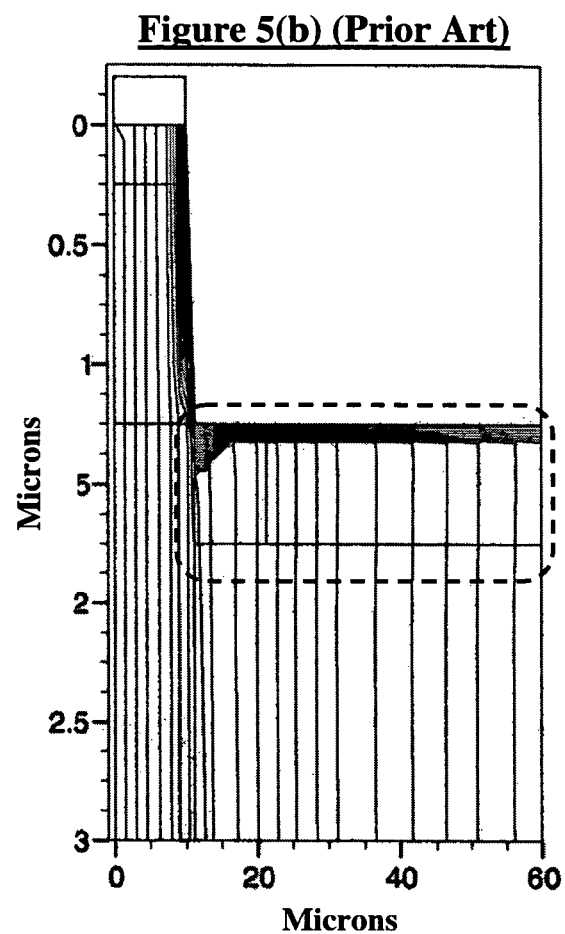

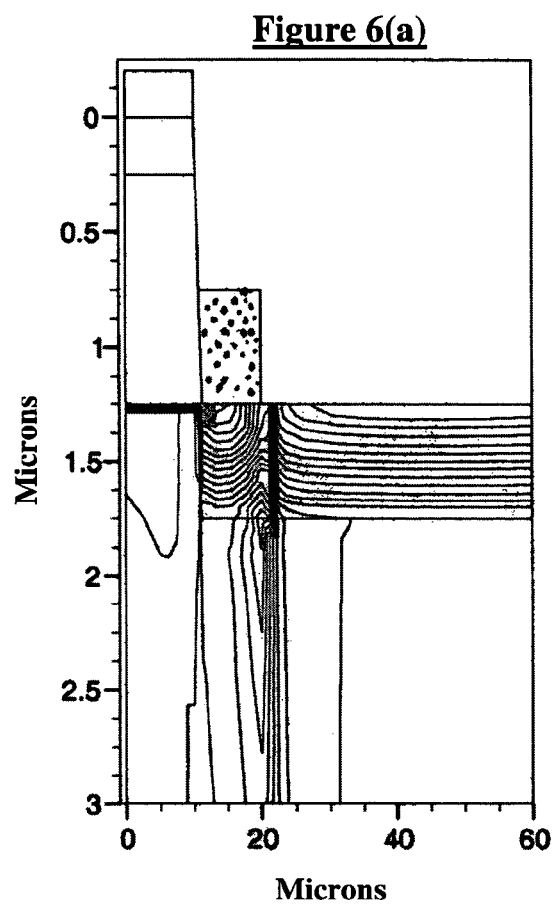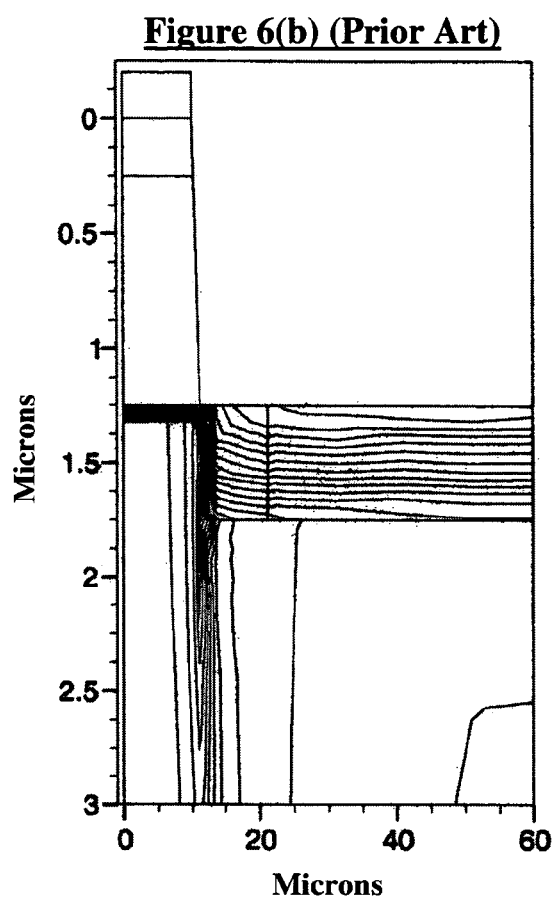
Figure 6(a)
Figure 6(b) (Prior Art)

INTERACTING CURRENT SPREADER AND JUNCTION EXTENDER TO INCREASE THE VOLTAGE BLOCKED IN THE OFF STATE OF A HIGH POWER SEMICONDUCTOR DEVICE

GOVERNMENT INTEREST

The invention described herein may be manufactured, used, and/or licensed by or for the United States Government.

BACKGROUND OF THE INVENTION

1. Field of the Invention

The invention generally relates to high power semiconductor devices, and more particularly to field termination structures used for enhancing voltage blocking abilities of semiconductor devices.

2. Description of the Related Art

Several field termination structures and techniques are presently utilized in the industry. These include field plates, field rings, beveling, and surface implant termination or junction termination extension (JTE) and they all tend to increase the voltage blocking ability of semiconductor devices. As known to those skilled in the art, field plates are metal contacts that do not conduct but instead alter the surface potential to reduce the curvature of electrostatic fields at the surface of the semiconductor device. Usually, the field plates are isolated from the semiconductor material by an insulating oxide layer disposed in between the field plates and the semiconductor material. Moreover, field rings tend to extend the depletion region boundary along the surface of the semiconductor device and are typically embodied as implanted impurities in the semiconductor surface.

Beveling the edges of a vertical power semiconductor device has been shown to promote structural breakdown to occur within the bulk material of the semiconductor device rather than at the surface by reshaping the device so that higher fields are within the device. Additionally, surface implant termination or JTE usually achieves a less abrupt high to low dopant concentration transition with a gradual decrease in the dopant concentration between the high doped region and the drift region of the semiconductor device. In view of the above techniques, the industry has generally concluded that the JTE is the best field termination to use.

High power semiconductor devices are typically made from silicon and are used in applications of up to several kilovolts. However, applications using high power semiconductor devices may have been limited because of the lack of a p-n junction in silicon bipolar power devices when operating above 150° C. as is easily reached when handling high powers. Also, for some silicon devices to block very high voltages, either the drift region had to be very thick, or several devices had to be connected in series. Both cases are inferior because thicker drift regions lead to slow switching, and having several devices in series may cause reliability problems unless the devices are identical and display the same characteristics over time. Nonetheless, the industry continues to strive to develop high power semiconductor devices which achieve high voltage blocking with low on-state voltage over a large current range with fast switching.

SUMMARY OF THE INVENTION

In view of the foregoing, an embodiment of the invention provides a semiconductor device comprising an electrode, a drift region adjacent to the electrode, a junction termination extension implant region in the drift region, and a current spreader adjacent to the junction termination extension implant region and the electrode. The current spreader is adapted to reduce current densities and electrostatic fields (preferably simultaneously) in an area connecting the electrode with the drift region. Moreover, the current spreader is adapted to spread current flowing from the electrode into the drift region. The semiconductor device further comprises an ohmic metal contact connected to the electrode and an implant pocket in the drift region, wherein the implant pocket is adapted for terminating electrostatic field lines in the semiconductor device. Preferably, the current spreader comprises an ohmic metal and the electrode comprises any of an anode and a cathode.

Additionally, an embodiment of the invention provides a semiconductor device comprising a first electrode, a drift region adjacent to the first electrode, a second electrode adjacent to the drift region, a junction termination extension implant region in the drift region, and a current spreader adjacent to the junction termination extension implant region and the first electrode, wherein the current spreader is adapted to reduce current densities and electrostatic fields (preferably simultaneously) in an area connecting the first electrode with the drift region. Additionally, the current spreader is adapted to spread current flowing from the first electrode into the drift region. The semiconductor device further comprises a plurality of ohmic metal contacts connected to each of the first electrode and the second electrode and an implant pocket in the drift region, wherein the implant pocket is adapted for terminating electrostatic field lines in the semiconductor device. Preferably, the current spreader comprises an ohmic metal and the first electrode and second electrode comprises any of an anode and a cathode.

Another aspect of the invention provides a method of spreading current flowing in a semiconductor device, wherein the method comprises forming an electrode adjacent to a drift region, implanting a junction termination extension implant region in the drift region, positioning a current spreader adjacent to the junction termination extension implant region, and applying voltage to the semiconductor device resulting in a flow of current in the semiconductor device, wherein the step of positioning reduces a concentration of the current in an area connecting the electrode with the drift region. Furthermore, the step of positioning reduces current densities and electrostatic fields (preferably simultaneously) in the area connecting the electrode with the drift region. Also, the step of positioning spreads current flowing from the electrode into the drift region. The method further comprises connecting an ohmic metal contact to the electrode and configuring an implant pocket in the drift region, wherein the implant pocket is adapted for terminating electrostatic field lines in the semiconductor device. Preferably, the current spreader comprises an ohmic metal and the electrode comprises any of an anode and a cathode.

The embodiments of the invention achieve several advantages including that the embodiments of the invention are simple to implement because the fabrication processes for depositing the ohmic contact can also be used to deposit the current spreader. As such, no additional mask plates are needed, thereby reducing manufacturing time and costs.

Furthermore, the embodiments of the invention increase the voltage blocked in high power semiconductor devices compared to conventional techniques for increasing the blocked voltage.

The embodiments of the invention are particularly advantageous in wide bandgap semiconductor devices, and more particularly, the embodiments of the invention may be utilized in silicon high-voltage product lines, with a potential use for these techniques in high power semiconductor devices made from silicon carbide (SiC) and other wide bandgap semiconductors including AlGaN. SiC and other wide bandgap materials tend to offer several advantages including the ability to operate bipolar devices at temperatures above 300° C., faster switching than silicon devices, and the ability to block higher voltages with thinner materials such that fewer devices are needed in series.

In particular, the SiC or other wide bandgap semiconductor material based devices that will benefit greatly from the field termination techniques provided by the embodiments of the invention include, but are not limited to, p-i-n diodes, IGBTs, thyristors, transistors and, in particular, any semiconductor device that would use a JTE to increase the voltage blocked in reverse bias. The above-mentioned devices are high power switches and are optimized for low leakage current when biased with a high reverse voltage (off state) and high current conduction with low applied forward voltage. Also, high frequency modulators requiring high reverse blocking can advantageously make use of the embodiments of the invention.

Additionally, several applications of the embodiments of the invention are possible in such areas as high voltage differential circuits (HVDC), traction circuits, motor control, factory automation, lamp ballasts, telecom circuits, display drives, automotive electronics and power supplies, among others.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 4 is a second graphical diagram illustrating results achieved by an embodiment of the invention;

FIG. 5(a) is a third graphical diagram illustrating results achieved by an embodiment of the invention;

FIG. 5(b) is a first graphical diagram illustrating results achieved by the prior art;

FIG. 6(a) is a fourth graphical diagram illustrating results achieved by an embodiment of the invention;

FIG. 6(b) is a second graphical diagram illustrating results achieved by the prior art;

DETAILED DESCRIPTION OF PREFERRED EMBODIMENTS OF THE INVENTION

Figure 1:
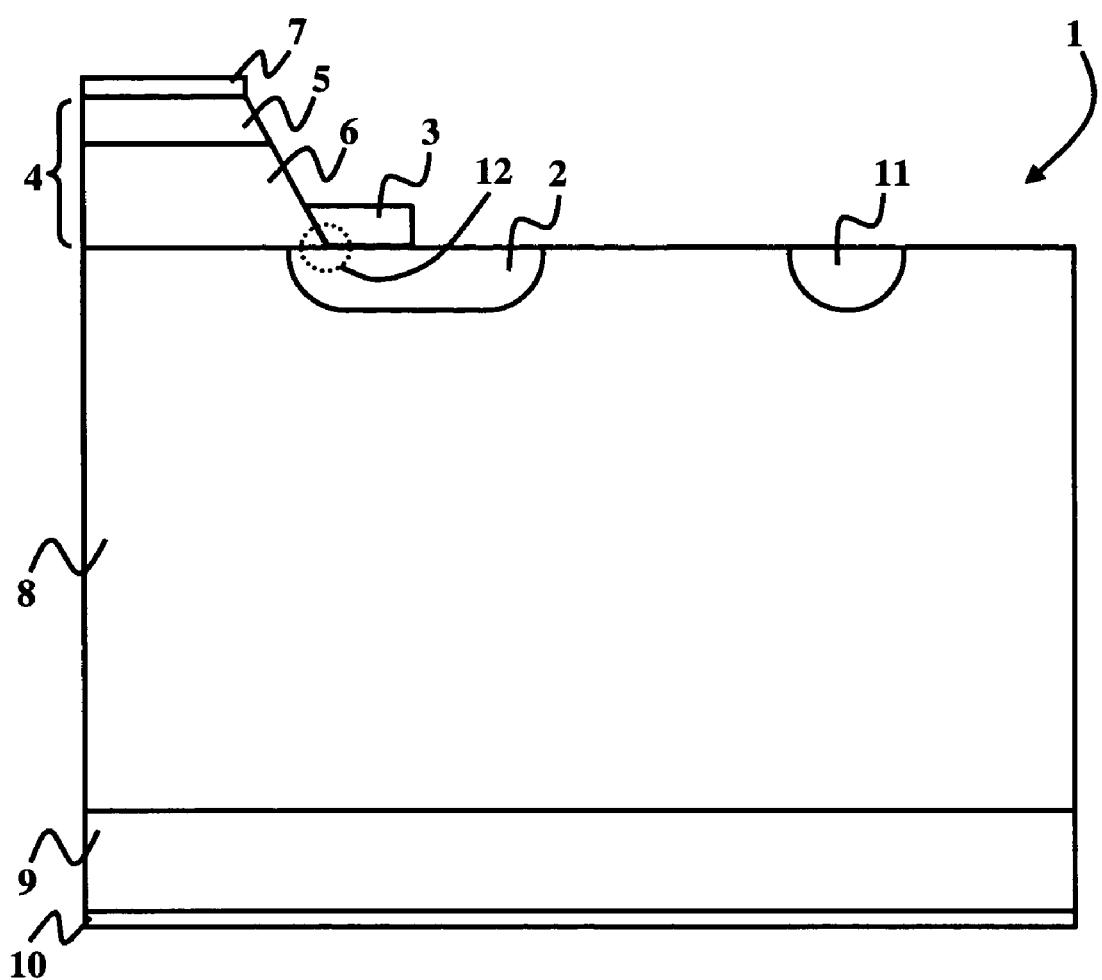
FIG. 1 is a schematic diagram of a semiconductor device according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As previously mentioned, there remains a need for a novel high power semiconductor device that achieves high voltage blocking with low on-state voltage over a large current range with fast switching. Referring now to the drawings, and more particularly to FIGS. 1 through 4, 5(a), 6(a), and 7(a) through 7(b), there are shown preferred embodiments of the invention.

FIG. 1 illustrates an embodiment of the structure of a semiconductor device 1 which implements the invention. Generally, the invention includes a junction termination extension (JTE) implant region 2 combined with an ohmic contact current spreader (CS) region 3. The CS region 3 spreads the current as it flows from a first electrode region 4 (collectively the first electrode region 4 comprises an upper portion 5 and a lower portion 6) into the drift region 8 so that "very high current densities" and "high electrostatic fields" are not simultaneously present in a very small junction (junction corner) 12 between the JTE implant region 2, the CS region 3 and the first electrode region 4 (shown as the circled area in FIG. 1).

What constitutes "very high current densities" and "high electrostatic fields" is determined by the calculation for the carrier generation rate by impact ionization. At each location (point) in the semiconductor device 1 the carrier generation rate is calculated based on the electrostatic field and the current density at the point. Then, using this carrier generation rate, a new current density is calculated at this point to determine if the current density is sufficiently high enough such that as the field increases, the current increases. This determines the limiting voltage that the semiconductor device 1 can block. The impact ionization, in its simple form, is proportional to current density and the exponent of the field. Therefore, impact ionization, the mechanism that limits the voltage blocked, is largest when both the current density and electrostatic field are high at the same location.

The CS region 3 preferably has a low contact resistance (approximately less than $1.0 \times 10^{-4}$ ohm-cm$^2$) at both the first electrode region 4 and JTE implant region 2. By having a low contact resistance at both the first electrode region 4 and the JTE implant region 2, the current can flow from the first electrode region 4 into the current spreader region 3 and then enter the JTE implant region 2 away from the mesa isolation junction corner 12. The current density is high where the current enters the JTE implant region 2. Thus, it is desirable to have a high current density to be away from the high field region, which is at the mesa isolation junction corner 12.

Additionally, the semiconductor device 1 comprises an implant pocket 11 in the drift region 8 for terminating electrostatic field lines. The semiconductor device 1 further comprises a second electrode region 9 adjacent to the drift region 8 and a pair of ohmic contacts 7, 10, preferably comprising metal, attached to the first electrode region 4 and second electrode region 9, respectively. The first electrode region 4 may be embodied as either a positively charged electrode (anode) or a negatively charged electrode (cathode). Similarly, the second electrode region 9 may be embodied as either a positively charged electrode (anode) or a negatively charged electrode (cathode), whereby if the first electrode region 4 is configured as an anode, then the second electrode region 9 is configured as a cathode, and vice versa. During operation, voltage is applied to the semiconductor device 1, thereby causing current to flow through the semiconductor device 1 by entering or leaving the ohmic contacts 7, 10. Furthermore, all of the regions in the semiconductor device 1 except for the current spreader 3 and ohmic contacts 7, 10, are preferably semiconductor regions and may comprise silicon carbide, silicon, gallium arsenide, gallium nitride, indium phosphide, aluminum gallium nitride, or other similar semiconductor materials.

Without the inventive CS region 3, "very high current densities" and "high electrostatic fields", as previously defined, would simultaneously exist. Accordingly, the embodiments of the invention help a high power device, such as the semiconductor device 1 of FIGS. 1 and 2, block higher off-state voltages by reducing the leakage current generated by impact ionization at a given applied bias. This generated current at the junction 12 in the semiconductor device 1 is proportional to the product of the current density and the exponent of the electrostatic field at that location. By adding the current spreader 3, which is preferably embodied as an ohmic metal layer, the high current density is spread laterally away from the junction 12 where the high fields occur. In one embodiment, the current spreader 3 is in direct contact with both a lower portion 6 of the first electrode region 4 and the JTE implant region 2.

Figure 2:
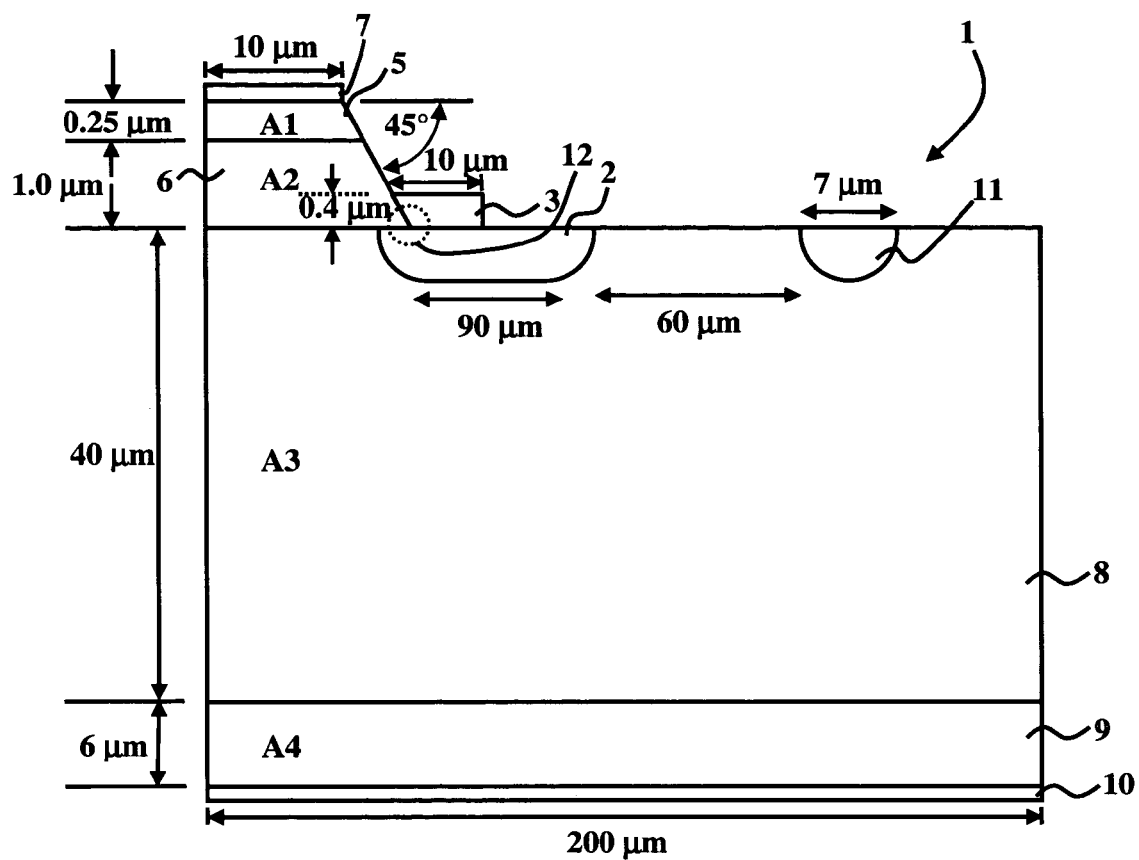
FIG. 2 is a schematic diagram illustrating an example of a semiconductor device according to an embodiment of the invention.

Preferably, the current spreader 3 is formed by e-beam evaporation or sputtering of a metal that would form an ohmic contact with the semiconductor it is in contact with. FIG. 2 illustrates an example of a semiconductor device 1, such as a pin diode, which implements the invention. While specific dimensions are provided in FIG. 2, the invention is not limited to the dimensions provided, but are rather provided as an example and are used in manufacturing the semiconductor device 1 used for experimentation, the results (of implementation) of which are further described in FIGS. 3 through 5(*a*), and 6(*a*). As shown in FIG. 2, the four implant regions A1, A2, A3, and A4 include the following dopant concentrations provided in Table 1, where $N_A$ is the dopant concentration of acceptors and $N_D$ is the dopant concentration of donors.

TABLE 1

| Region | Dopant Concentrations Dopant Concentration (cm$^{-3}$) |
|---|---|
| A1 | $N_A = 5.0 \times 10^{19}$ |
| A2 | $N_A = 8.0 \times 10^{18}$ |
| A3 | $N_D = 5.0 \times 10^{14}$ |
| A4 | $N_D = 5.0 \times 10^{18}$ |

Figure 3:
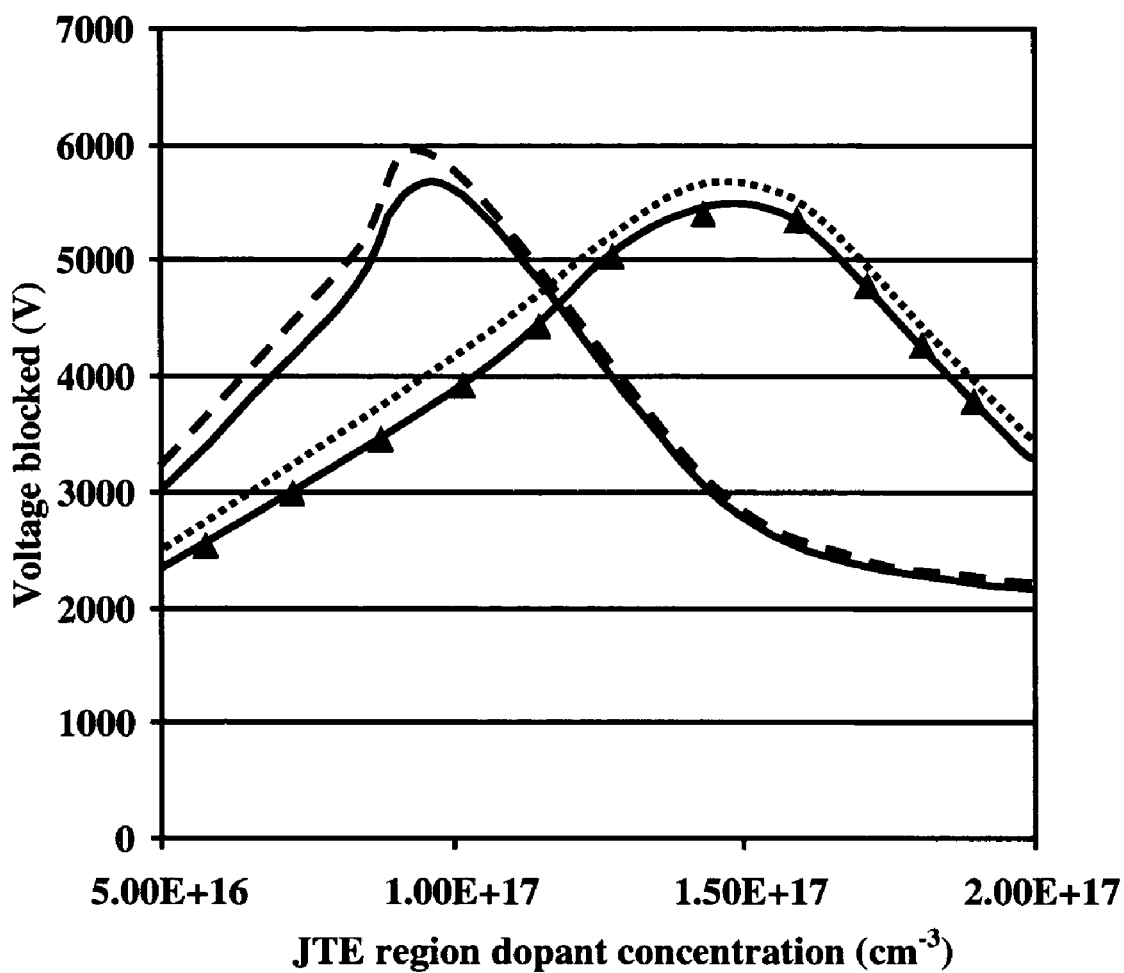
FIG. 3 is a first graphical diagram illustrating results achieved by an embodiment of the invention.

FIG. 3 shows the voltage blocked by the inventive structure and a conventional structure as the JTE region dopant concentration increases from $5.0 \times 10^{16}$ to $2.0 \times 10^{17}$ cm$^{-3}$. The dotted curve represents the results achieved by the embodiments of the invention for a 0.5 micron deep JTE implant region 2. The dashed curve represents the results achieved by the embodiments of the invention for a 0.8 micron deep JTE implant region 2. The solid curve with the triangle tick marks represents results achieved by a conventional device with a 0.5 micron deep JTE region, while the solid curve represents results achieved by a conventional device with a 0.8 micron deep JTE region.

FIG. 3 shows the increased voltage blocked by the structures using the invention's current spreader regions 3. As the curves in FIG. 3 illustrate, the embodiments of the invention outperform their compliment conventional devices. Specifically, at its peak, the invention for a 0.8 micron deep JTE implant region 2 blocks approximately 6000V at an approximate $1.0 \times 10^{17}$ cm$^{-3}$ JTE dopant concentration. Moreover, at is peak, the invention for a 0.5 micron deep JTE implant region 2 blocks approximately 5700V at an approximate $1.5 \times 10^{17}$ cm$^{-3}$ JTE dopant concentration.

FIG. 4 shows the electrostatic fields along a horizontal line taken immediately below the JTE implant region 2 of the 0.5 micron deep implanted JTE with a JTE dopant concentration of $1.5 \times 10^{17}$ cm$^{-3}$. The dotted line represents results achieved by the embodiments of the invention and the solid line represents results achieved by a conventional structure, where measurements for both were taken at a bias of 5400V. FIG. 4 shows that for the conventional structure the peak field is higher and located closer to the mesa isolation junction corner of the conventional device. On the other hand, the embodiments of the invention move the peak field away from the junction corner 12 of the semiconductor device 1 and reduce the magnitude of the peak field for the same reverse bias across the semiconductor device 1.

FIG. 5(*a*) is a current flow plot for the embodiments of the invention and FIG. 5(*b*) is a current flow plot for a conventional pin diode with an optimized JTE, wherein an optimized JTE design is defined as one that has an optimized implant depth, width, and dopant concentrations to properly hold-off the greatest amount of voltage for a given semiconductor device structure. The dotted region in 5(*a*) is the current spreader 3 and, as illustrated, the current flow lines are concentrated at the lower right point of the current spreader 3 where the current exits. Conversely, without the current spreader 3, the current is concentrated in the mesa isolation junction corner as shown in FIG. 5(*b*). According to the embodiments of the invention, the electrostatic fields are highest in the region close to the mesa isolation junction corner 12 so by concentrating the current somewhere else, both values are not highest at the same location. The operating point for FIGS. 5(*a*) and 5(*b*) are the same as for the curves in FIG. 4 (5400V reverse bias across the device).

FIGS. 6(*a*) and 6(*b*) illustrate the electrostatic field lines for the same structure and operating point for the results shown in FIGS. 5(*a*) and 5(*b*). FIG. 6(*a*) illustrates that the embodiments of the invention prevent high electrostatic fields from being located at the same point as the high current density (FIG. 5(a)) compared to the conventional structure, which is illustrated in FIG. 6(b) where the high field point is at the same location as the high current density point of FIG. 5(b).

The results provided in FIG. 6(a) indicate that increasing the depth of the JTE implant region 2 has the added benefit of increasing the reverse voltage blocking gain of the embodiments of the invention over the conventional structures, and at the same time a lower concentration of the implant species is required, thus issues of activating implanted dopants are not as important. The percent increase in the voltage blocked is greater as the implant depth increases. In fact, the results indicate that the JTE implant region 2 provided by the embodiments of the invention performs ideally.

Figure 7A:
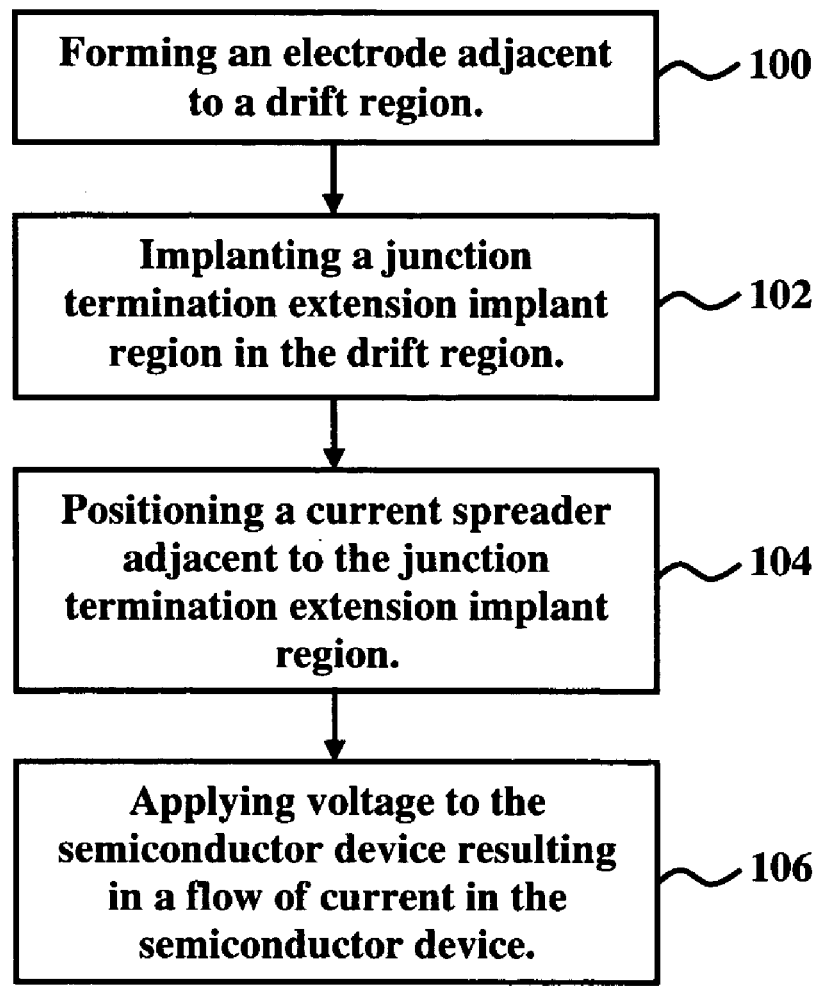
FIG. 7(a) is a flow diagram illustrating a preferred method of an embodiment of the invention.
Figure 7B:
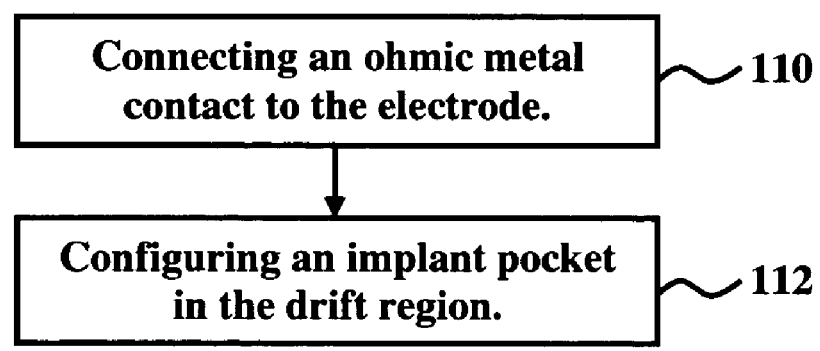
FIG. 7(b) is a flow diagram illustrating a method of an embodiment of the invention.

The flow diagram of FIGS. 7(a) and 7(b), which include descriptions which refer to components provided in FIGS. 1 and 2, illustrate a method of spreading current flowing in a semiconductor device 1 according to an embodiment of the invention, wherein as illustrated in FIG. 7(a) the method comprises forming (100) an electrode 4 adjacent to a drift region 8, implanting (102) a junction termination extension implant region 2 in the drift region 8, positioning (104) a current spreader 3 adjacent to the junction termination extension implant region 2, and applying (106) voltage to the semiconductor device 1 resulting in a flow of current in the semiconductor device 1.

The step of positioning (104) reduces a concentration of the current in an area (junction corner 12) connecting the electrode 4 with the drift region 8. Furthermore, the step of positioning (104) reduces current densities and electrostatic fields (preferably simultaneously) in the area (junction corner) 12 connecting the electrode 4 with the drift region 8. Also, the step of positioning (104) spreads current flowing from the electrode 4 into the drift region 8.

As shown in FIG. 7(b), the method further comprises connecting (110) an ohmic contact 7 to the electrode 4 and configuring (112) an implant pocket 11 in the drift region 8, wherein the implant pocket 11 is adapted for terminating electrostatic field lines in the semiconductor device 1. Preferably, the current spreader 3 comprises an ohmic metal and the electrode 4 comprises any of an anode and a cathode.

The embodiments of the invention achieve several advantages including that the embodiments of the invention are simple to implement because the fabrication processes for depositing the ohmic contact 7 can also be used to deposit the current spreader 3. As such, no additional mask plates are needed, thereby reducing manufacturing time and costs. Furthermore, the embodiments of the invention increase the voltage blocked in high power semiconductor devices compared to conventional techniques for increasing the blocked voltage. As previously mentioned, and as further demonstrated in FIG. 6(b), the conventional designs tend to reshape the electrostatic field but do nothing about the current flow in the device. Conversely, the embodiments of the invention solve this two-pronged problem from both the perspective of reshaping the electrostatic field and redistributing the current in the semiconductor device 1 to obtain a better result of the amount of voltage blocked in the semiconductor device 1.

The embodiments of the invention are particularly advantageous in wide bandgap semiconductor devices, and more particularly, the embodiments of the invention may be utilized in silicon high-voltage product lines, with a potential use for these techniques in high power semiconductor devices made from silicon carbide (SiC) and other wide bandgap semiconductors including AlGaN. SiC and other wide bandgap materials tend to offer several advantages including the ability to operate bipolar devices at temperatures above 300° C., faster switching than silicon devices, and the ability to block higher voltages with thinner materials such that fewer devices are needed in series.

In particular, the SiC or other wide bandgap semiconductor material based devices that will benefit greatly from the field termination techniques provided by the embodiments of the invention include, but are not limited to, p-i-n diodes, IGBTs, thyristors, transistors and in particular any semiconductor device that would use a JTE to increase the voltage blocked in reverse bias. The above-mentioned devices are high power switches and are optimized for low leakage current when biased with a high reverse voltage (off state) and high current conduction with low applied forward voltage. Also, high frequency modulators requiring high reverse blocking can advantageously make use of the embodiments of the invention.

Additionally, several applications of the embodiments of the invention are possible in such areas as high voltage differential circuits (HVDC), traction circuits, motor control, factory automation, lamp ballasts, telecom circuits, display drives, automotive electronics and power supplies, among others.

Generally, the embodiments of the invention provide a combination of a junction termination extender 2 and a current spreader (preferably a metal ohmic contact) 3 to spread the current out of a semiconductor device 1. The other regions of the semiconductor device 1, except for the current spreader 3 and ohmic contacts 7, 10, are semiconductor regions and could include such materials as silicon carbide, silicon, gallium arsenide, gallium nitride, indium phosphide, aluminum gallium nitride, or a host of other semiconductor materials. The inventive combination of a junction termination extender 2 and the current spreader 3 reduces the impact generation current at a given voltage bias because the current is not concentrated at the location (junction corner 12) of the high electrostatic field.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. A semiconductor device comprising:
   an electrode;
   a drift region adjacent to said electrode;
   a junction termination extension implant region in said drift region; and
   a current spreader comprising an ohmic metal layer adjacent to said junction termination extension implant region and said electrode, wherein said current spreader is adapted to reduce electrostatic fields in an area connecting said electrode with said drift region.

2. The semiconductor device of claim 1, wherein said current spreader is adapted to reduce current densities in an area connecting said electrode with said drift region.

3. The semiconductor device of claim 1, wherein said current spreader is adapted to simultaneously reduce current densities and electrostatic fields in an area connecting said electrode with said drift region.

4. The semiconductor device of claim 1, wherein said current spreader is adapted to spread current flowing from said electrode into said drift region.

5. The semiconductor device of claim 1, further comprising:
an implant pocket in said drift region, wherein said implant pocket is adapted for terminating electrostatic field lines in said semiconductor device.

6. The semiconductor device of claim 1, wherein said ohmic metal layer is in contact with a lower portion of said electrode and said junction termination extension implant region and is adapted to diminish current density by spreading current laterally away from a junction of said electrode and said junction termination extension implant region.

7. The semiconductor device of claim 1, wherein said electrode comprises any of an anode and a cathode.

8. The semiconductor device of claim 1, wherein:
said electrode overlays a portion of said drift region and a portion of said junction termination extension implant region;
said electrode having an edge overlaying said junction termination extension implant region to form a junction corner area proximate the electrode edge and said junction termination extension implant region; and
said ohmic metal layer overlays said at least a portion of said electrode edge and said at least a portion of said junction termination extension implant region and said junction corner area.

9. A semiconductor device comprising:
a first electrode;
a drift region adjacent to said first electrode;
a second electrode adjacent to said drift region;
a junction termination extension implant region in said drift region; and
a current spreader comprising an ohmic metal layer adjacent to said junction termination extension implant region and said first electrode, wherein said current spreader is adapted to reduce electrostatic fields in an area connecting said first electrode with said drift region.

10. The semiconductor device of claim 9, wherein said current spreader is adapted to reduce current densities in an area connecting said first electrode with said drift region.

11. The semiconductor device of claim 9, wherein said current spreader is adapted to simultaneously reduce current densities and electrostatic fields in an area connecting said first electrode with said drift region.

12. The semiconductor device of claim 9, wherein said current spreader is adapted to spread current flowing from said first electrode into said drift region.

13. The semiconductor device of claim 9, further comprising:
an ohmic metal contact connected to said second electrode; and
an implant pocket in said drift region, wherein said implant pocket is adapted for terminating electrostatic field lines in said semiconductor device.

14. The semiconductor device of claim 9, wherein said ohmic metal layer is in contact with a lower portion of said first electrode and said junction termination extension implant region and is adapted to diminish current density by spreading current laterally away from a junction of said first electrode and said junction termination extension implant region.

15. The semiconductor device of claim 9, wherein said first electrode comprises any of an anode and a cathode.

16. The semiconductor device of claim 9, wherein said second electrode comprises any of an anode and a cathode.

17. The semiconductor device of claim 9, wherein:
said first electrode overlays a portion of said drift region and a portion of said junction termination extension implant region;
said first electrode having an edge overlaying said junction termination extension implant region to form a junction corner area proximate the first electrode edge and said junction termination extension implant region; and
said ohmic metal layer overlays said at least a portion of said first electrode edge and said at least a portion of said junction termination extension implant region and said junction corner area.

18. A method of spreading current flowing in a semiconductor device, said method comprising:
forming an electrode adjacent to a drift region;
implanting a junction termination extension implant region in said drift region;
positioning a current spreader comprising an ohmic metal layer adjacent to said junction termination extension implant region and said electrode; and
applying voltage to said semiconductor device resulting in a flow of current in said semiconductor device,
wherein said positioning reduces a concentration of said current in an area connecting said electrode with said drift region, and wherein said positioning reduces electrostatic fields in said area connecting said electrode with said drift region.

19. The method of claim 18, wherein said positioning reduces current densities in said area connecting said electrode with said drift region.

20. The method of claim 18, wherein said positioning simultaneously reduces current densities and electrostatic fields in said area connecting said electrode with said drift region.

21. The method of claim 18, wherein said positioning spreads current flowing from said electrode into said drift region.

22. The method of claim 18, further comprising:
connecting said ohmic metal layer to said electrode; and
configuring an implant pocket in said drift region, wherein said implant pocket is adapted for terminating electrostatic field lines in said semiconductor device.

23. The method of claim 18, wherein in said forming, said electrode comprises any of an anode and a cathode.

24. The method of claim 18, wherein:
the electrode overlays a portion of said drift region and a portion of said junction termination extension implant region and includes an edge overlaying said junction termination extension implant region to form a junction corner area proximate the electrode edge and said junction termination extension implant region; and
the step of positioning a current spreader provides said ohmic metal layer onto the electrode, the junction termination extension implant region, and the junction corner area;
whereby the current spreader acts to diminish high current density at the junction corner area by spreading the flow of current throughout the ohmic metal layer.

* * * * *